United States Patent
Yano et al.

(10) Patent No.: US 7,385,844 B2
(45) Date of Patent: Jun. 10, 2008

(54) SEMICONDUCTOR DEVICE AND METHOD OF CONTROLLING THE SAME

(75) Inventors: Masaru Yano, Tokyo (JP); Hideki Arakawa, Kanagawa (JP); Mototada Sakashita, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 146 days.

(21) Appl. No.: 11/494,872

(22) Filed: Jul. 27, 2006

(65) Prior Publication Data

US 2007/0025154 A1 Feb. 1, 2007

Related U.S. Application Data

(63) Continuation-in-part of application No. PCT/JP05/13762, filed on Jul. 27, 2005.

(51) Int. Cl.
*G11C 16/04* (2006.01)

(52) U.S. Cl. .................. 365/185.03; 365/189.01; 365/219

(58) Field of Classification Search ........... 365/185.03, 365/185.18, 189.01, 219, 220, 221, 230.04
See application file for complete search history.

(56) References Cited

U.S. PATENT DOCUMENTS

| 4,122,531 | A | * | 10/1978 | Tamaru et al. ........ 365/230.03 |
| 4,219,883 | A | * | 8/1980 | Kobayashi et al. ..... 365/189.02 |
| 4,443,860 | A | * | 4/1984 | Vidalin .................... 707/1 |
| 4,450,557 | A | * | 5/1984 | Munter .................. 370/363 |
| 6,426,895 | B2 | * | 7/2002 | Kosaka et al. ......... 365/185.19 |
| 6,934,194 | B2 | * | 8/2005 | Takahashi et al. ...... 365/185.29 |
| 2001/0053092 | A1 | | 12/2001 | Kosaka et al. ......... 365/185.19 |
| 2004/0027858 | A1 | | 2/2004 | Takahashi et al. ...... 365/185.17 |

FOREIGN PATENT DOCUMENTS

| JP | 7240098 | 9/1995 |
| JP | 2002279789 | 9/2002 |

\* cited by examiner

*Primary Examiner*—Gene N. Auduong

(57) ABSTRACT

A semiconductor device includes: a memory cell array that has a plurality of non-volatile memory cells each having a first bit and a second bit in different regions in a charge storing layer; an SRAM array (first memory unit) that stores data to be written into the memory cell array; a WR sense amplifier block (second memory unit) that stores first divided data to be written into the first bit and second divided data to be written into the second bit, the first divided data being formed by dividing the data into predetermined units, the second divided data being formed by dividing the data into predetermined units; and a control circuit that writes the second divided data into the first bit of the memory cells of the memory cell array (step S28) after writing the first divided data into the second bit of the memory cells of the memory cell array (step S22).

28 Claims, 10 Drawing Sheets

SEMICONDUCTOR DEVICE AND METHOD OF CONTROLLING THE SAME

CROSS-REFERENCES TO RELATED APPLICATIONS

This is a continuation in part of International Application No. PCT/JP2005/013762, filed Jul. 27, 2005 which was not published in English under PCT Article 21(2).

TECHNICAL FIELD

The present invention generally relates to a semiconductor device and a method of controlling the semiconductor device, and more particularly, to a semiconductor device having two bits of charge storing regions in each one memory cell, and a method of controlling the semiconductor device.

BACKGROUND OF THE INVENTION

Description of the Related Art

In recent years, non-volatile memories that are data-rewritable semiconductor devices are widely used. In a flash memory that is a typical non-volatile memory, each transistor forming a memory cell has a floating gate or an insulating film called a charge storing layer. Data storing is performed by storing charges in such charge storing layers.

There are SONOS (Silicon Oxide Nitride Oxide Silicon) flash memories that store charges in trap layers formed with silicon nitride layers for higher storage capacity. Among such SONOS flash memories, there are flash memories each having two charge storing regions in the charge storing layer of each transistor. For example, U.S. Pat. No. 6,011,725 discloses a memory cell (a transistor) having two charge storing regions between the gate electrode and the semiconductor substrate. This memory cell is a virtual-ground memory cell that symmetrically drives the source and the drain that are replaced with each other. Two bits can be stored in the single memory cell.

Japanese Unexamined Patent Publication No. 2004-79602 discloses an operating mode of storing one bit in each one memory cell, so as to shorten the data writing period in a virtual-ground flash memory. In this operating mode, one of the two charge storing regions in each memory cell is an auxiliary bit (a first bit) not to be used for storing data, while the other one is a bit (a second bit) to be used for storing data. When the first bit in a memory cell is in a written state, writing into the second bit can be performed at a very high speed. Writing in each bit is performed by grounding the source and applying a high voltage to the drain and the gate to cause hot electron injection. Writing in the first bit and the second bit is performed by switching between the source and the drain.

In a NAND flash memory, on the other hand, writing and reading are performed collectively by the page (2 Kbytes, for example). Therefore, a NAND flash memory has a latch circuit that stores the data of one page, and the data of one page is written at once from the latch circuit into the memory cell array. Such a NAND flash memory normally has memory cells each having a floating gate as the charge storing layer. Writing into each memory cell is performed by generating a high potential between the control gate on the floating gate and the substrate to cause a FN tunneling phenomenon.

As virtual-ground flash memories, flash memories having interfaces of NAND type are being studied. A large amount of data, as large as the data of one page, can be written at once in a conventional NAND flash memory that utilizes a FN tunneling phenomenon. In a virtual-ground flash memory, on the other hand, data writing is performed through a hot electron phenomenon. Because of this, the current required for a writing operation is high, and the amount of data that can be written at once is small. Accordingly, it is difficult to write the data of one page in a short period of time. The prior arts do not suggest a specific method of writing data from the latch circuit into the memory cell array in a short period of time in a case where a virtual-ground flash memory capable of storing two bits in each one memory cell is used in the operating mode of storing one bit in each one memory cell.

SUMMARY OF THE INVENTION

It is therefore an object of the present invention to provide a semiconductor device and a method of controlling the semiconductor device in which the above disadvantage is eliminated. A more specific object of the present invention is to provide a semiconductor device that can shorten the period of time required for writing data in a case where one bit is stored in each one memory cell in a flash memory that can store two bits in each one memory cell, and a method of controlling the semiconductor device.

According to a first aspect of the present invention, there is provided a semiconductor device including: a memory cell array that has a plurality of non-volatile memory cells each having a first bit and a second bit in different regions in a charge storing layer; a first memory unit that stores data to be written into the memory cell array; a second memory unit that stores first divided data to be written into the first bit and second divided data to be written into the second bit, the first divided data being formed by dividing the data into predetermined units, the second divided data being formed by dividing the data into predetermined units; and a control circuit that writes the second divided data into the memory cell array after writing the first divided data into the memory cell array.

According to a second aspect of the present invention, there is provided a method of controlling a semiconductor device that has a memory cell array having non-volatile memory cells each having a first bit and a second bit in different regions in a charge storing layer, the method comprising the steps of: storing, in a first memory unit, data to be written into the memory cell array; storing, in a second memory unit, first divided data to be written into the first bit, the first divided data being formed by dividing the data into predetermined units, writing the first divided data into the memory cell array; storing, in the second memory unit, second divided data to be written into the second bit, the second divided data being formed by dividing the data into predetermined units; and writing the second divided data into the memory cell array after writing the first divided data into the memory cell array.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to the accompanying drawings, of embodiments of the present invention.

First Embodiment

A first embodiment of the present invention is an example of a virtual-ground flash memory having a NAND interface. In the flash memory, each memory cell is the same as the non-volatile memory cell disclosed in U.S. Pat. No. 6,011,725, which is a SONOS flash memory cell having a silicon nitride film as the charge storing layer. Two bits of a first bit and a second bit can be written in different charge storing regions in the charge storing layer. In each of those memory cells, if one of the bits (the first bit, for example) is already written, the other bit (the second bit) can be written at a high speed. Therefore, an operating mode in which only the other bit (the second bit) is normally used may be employed. Hereinafter, "0" represents a state in which charges (electrons) are stored in the charge storing regions of a memory cell, while "1" represents a state in which no charges are stored in the charge storing regions.

Input and output to and from the outside are performed through a NAND interface, and data writing and reading are performed by the page. In the first embodiment, the amount of data in one page is 2 Kbytes. However, writing and reading in the memory cell array are performed by the divided data unit amount that is obtained by dividing the data in one page by 32. This is because the amount of current required for a writing operation is large, and the amount of data that can be written at once is small. In the first embodiment, the size of the divided data is 536 bits (of which the size of the regular data is 512 bits). However, data sizes are not limited to those.

Figure 1:
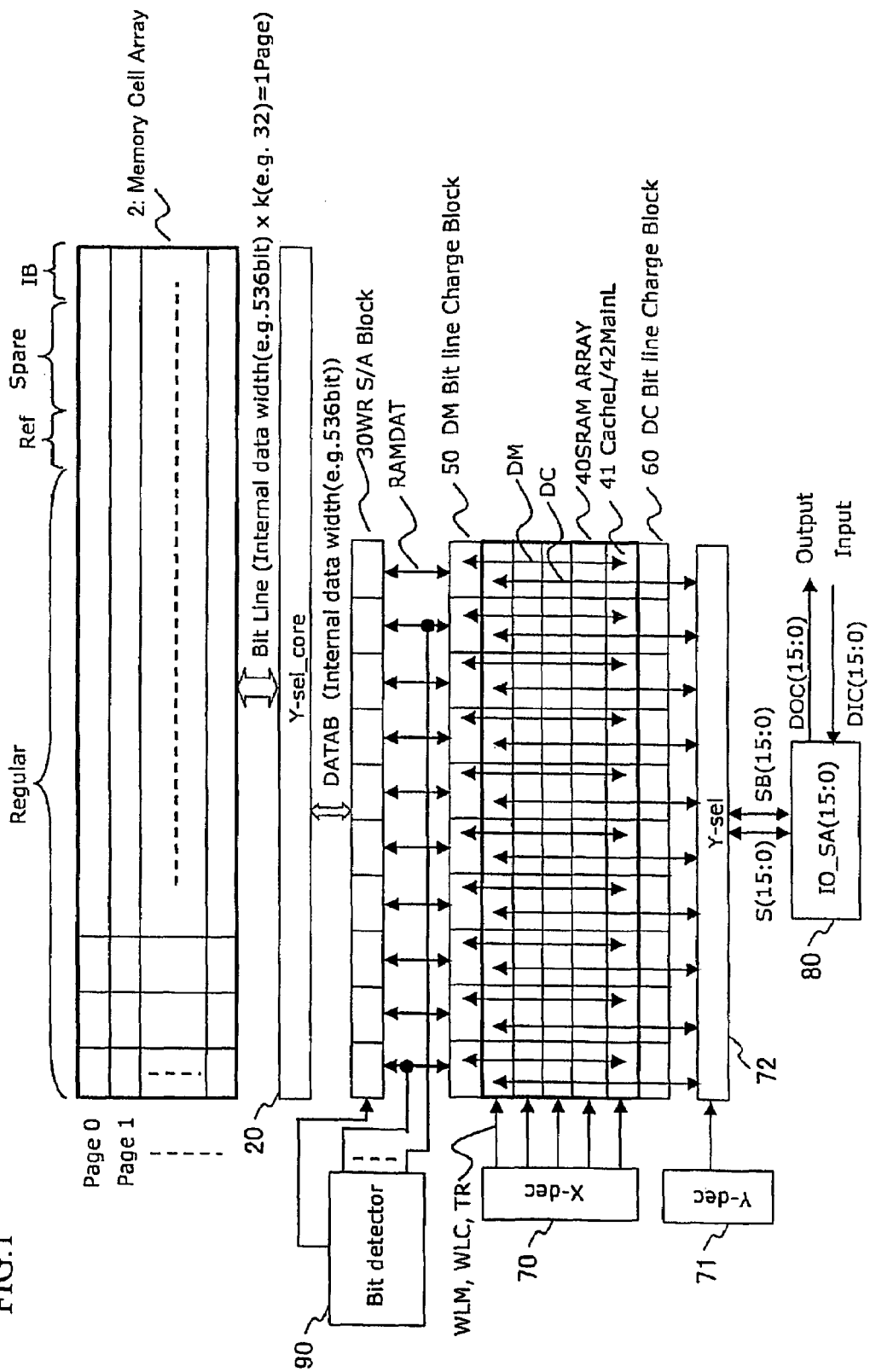
FIG. 1 is a block diagram of a memory cell array and the peripherals of a SRAM array of a flash memory in accordance with a first embodiment of the present invention.

FIG. 1 is a block diagram showing a memory cell array 2 and the peripherals of a SRAM array 40 of a flash memory in accordance with the first embodiment. In the memory cell array 2, memory cells are arranged along word lines (not shown) extending in the lateral direction of the drawing, and also along bit lines (not shown) extending in the vertical direction of the drawing. The region connected to one word lines is equivalent to the region that stores the data of one page. The regions of pages are arranged in the vertical direction. The region of each one page includes a regular memory region (Regular), a reference memory region (Ref), a spare region (Spare), and an indicator bit region (IB). The regular memory region stores the data to be stored in the flash memory, and stores regular data. The indicator bit region stores a flag (an indicator bit) that indicates whether inverted data has been written. The reference memory region has cells to be used as the reference at the time of data reading. The spare region has cells that store file management data and the likes.

Y-sel_core 20 that is connected to the memory cell array 2 via a bit line is a circuit for selecting a memory cell of a unit amount of divided data (536 bits) from the data of one page. Each unit of divided data (536 bits) is called an internal access window. Among the 536 bits, 512 bits are allocated for regular data, 4 bits are allocated in the indicator bit region, 16 bits are allocated in the spare region, and 4 bits are allocated in the reference region. A WR sense amplifier block 30 connected to the Y-sel_core 20 with DATAB is a circuit that reads or writes the data stored in the SRAM array 40 into the memory cell array 2 by the divided data unit.

The SRAM array 40 is a volatile memory cell array that includes main latch circuits 42 connected to the WR sense amplifier block 30 and cache latch circuits 41 connected to an IO_SA (15:0) circuit 80. The SRAM cells that are the cache latch circuits 41 and the main latch circuits 42 are arranged along word lines (WLC and WLM, not shown) extending in the lateral direction in the drawing and along bit lines (DC and DM) extending in the vertical direction in the drawing. Here, WLC and WLM are the word lines for the cache latch circuits 41 and the main latch circuits 42, respectively, and DC and DM are the bit lines for the cache latch circuits 41 and the main latch circuits 42, respectively.

The cells connected to the same word line (in the same row) are equivalent to an internal access window. More specifically, the cache latch circuits 41 and the main latch circuits 42 of 536 bits are arranged in each one row. In the example shown in FIG. 1, 32 rows are provided in the vertical direction. Accordingly, the cache latch circuits 41 and the main latch circuits 42 of 2 Kbytes, which is the data amount of one page, are provided in the SRAM array 40. In conformity to the structure of the memory cell array 2, the SRAM array 40 includes a regular memory region (Regular), a reference memory region (Ref), a spare region (Spare), and an indicator bit region (IB). The SRAM array 40 further includes a DM bit line charge block 50 and a DC bit line charge block 60.

The DM bit line charge block 50 includes the sense amplifier circuits of the main latch circuits 42. The DM bit line charge block 50 precharges the DM bit lines to read the data from the main latch circuits 42. The DM bit line charge block 50 also serves as a circuit to control data transfer between the WR sense amplifier block 30 and the SRAM array 40. The WR sense amplifier block 30 includes a WR latch circuit 31 that holds write and read data of the memory cell array 2, a cascode amplifier 32, a differential sense amplifier 33, and a write amplifier circuit 34 (see FIG. 4). The WR sense amplifier block 30 is connected to the DM bit line charge block 50 with RAMDAT, and is also connected to the memory cell array 2 via the Y-sel_core 20.

A bit detector 90 is a circuit that counts, among the data (the divided data) on the RAMDAT, the number of bits in the "0" data for writing charges in the charge storing layers of the memory cells. Based on the count result, the bit detector 90 controls the WR sense amplifier block 30. The DC bit line charge block 60 includes the sense amplifier circuits for the cache latch circuits 41. The DC bit line charge block 60 precharges the DC bit lines to read the data from the cache latch circuits 41. The IO_SA (15:0) circuit 80 is a data input/output circuit. More specifically, the IO_SA (15:0) circuit 80 reads data from a cache latch circuit 41 selected by Y-sel 72, and outputs the data as the output data DOC to an external I/O terminal. The IO_SA (15:0) circuit 80 also writes input data DIC from an external I/O terminal into a cache latch circuit 41 selected by the Y-sel 72. X-dec 70 and Y-dec 71/Y-sel 72 are decoders for the SRAM array 40, and selects a cache latch circuit 41 or a main latch circuit 42 at the time of data writing or reading in the SRAM array 40.

With the above structure, data writing from the outside into the memory cell array 2 is performed as follows. It should be noted that the writing into the first bit and the second bit, and the data inversion by the bit detector 90 will be described later, with reference to FIG. 8. The data of one page is stored in a cache latch circuit 41 selected by the Y-sel 72, via the IO_SA (15:0) circuit 80. The input data DIC from the outside is input for each input/output bus width of 16 bits. The data in the cache latch circuit 41 is transferred to the main latch circuit 42. The input data is then read out by the DM bit line charge block 50 for every 536 bits of data (divided data) equivalent to the data amount of each one internal access window. The input data is written into memory cells selected by the Y-sel_core 20, via the write amplifier of the WR sense amplifier block 30. This is repeated 32 times, to complete the writing of one page.

Meanwhile, data reading from the memory cell array 2 to the outside is performed as follows. For every 536 bits of data (divided data) equivalent to the data amount of each one internal access window, data is read from memory cells selected by the Y-sel_core 20, into the WR sense amplifier block 30. Here, the data is inverted in accordance with the indicator bit, as described later. The data is stored in the corresponding main latch circuit 42 via the DM bit line charge block 50. This is repeated 32 times, to store the data of one page in the main latch circuits 42. The data in the main latch circuits 42 is then transferred to the cache latch circuits 41. The data is then output from a cache latch circuit 41 selected by the Y-sel 72 to the outside via the IO_SA (15:0). Here, the output data DOC is output for each input/output bus width of 16 bits.

Figure 2:
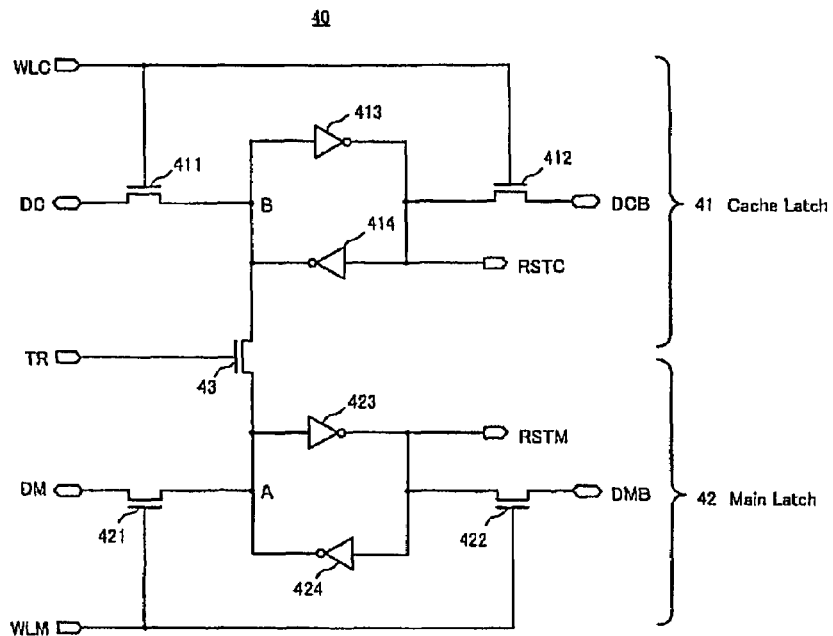
FIG. 2 is a circuit diagram showing a cache latch circuit and a main latch circuit in the SRAM array of the flash memory.

Next, the structure of each circuit is described. FIG. 2 is a circuit diagram showing the cache latch circuit 41 and the main latch circuit 42 for 1 bit in the SRAM array 40. As shown in FIG. 2, the cache latch circuit 41 includes n-FETs 411 and 412, and inverters 413 and 414. The main latch circuit 42 includes n-FETs 421 and 422, and inverters 423 and 424. The cache latch circuit 41 and the main latch circuit 42 are selected through a word line WLC and a word line WLM, respectively. When a word line WLC is selected, the cache latch circuit 41 of the corresponding internal access window is selected at the same time. When a word line WLM is selected, the main latch circuit 42 of the corresponding internal access window is selected at the same time.

A transfer transistor 43 that is an n-FET is connected between the cache latch circuit 41 and the main latch circuit 42. When TR is switched to the high level, the transfer transistor 43 is turned on, to transfer data between the cache latch circuit 41 and the main latch circuit 42. RSTM and RSTC are signals for resetting the cache latch circuit 41 and the main latch circuit 42, respectively.

Figure 3:
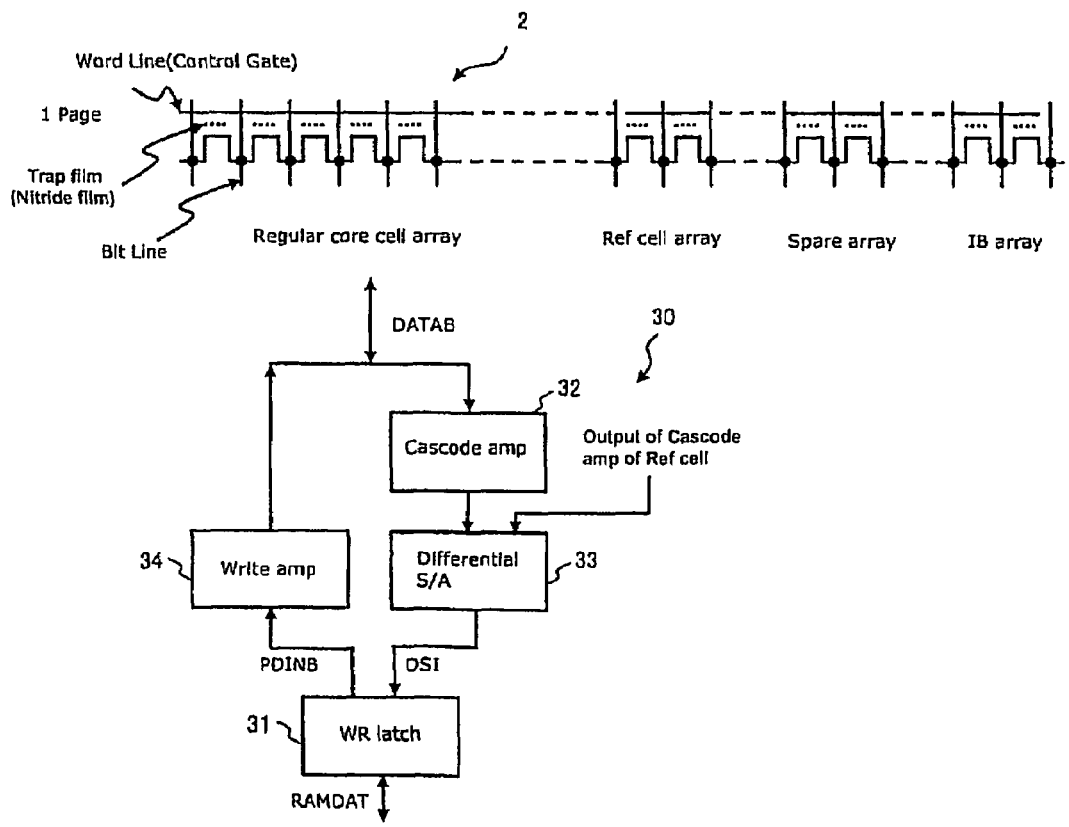
FIG. 3 is a block diagram of the circuit of 1 bit in the WR sense amplifier block of the flash memory.

FIG. 3 is a block diagram showing a 1-bit portion in the WR sense amplifier block 30. As shown in FIG. 3, WR sense amplifier block 30 includes the WR latch circuit 31, the cascode amplifier 32, and the differential sense amplifier 33. The WR sense amplifier block 30 is prepared in accordance with the number of internal access windows. The WR sense amplifier block 30 is connected to the memory cells of an internal access window selected by the Y-sel_core 20 from the one page stored in the memory cell array 2. The memory cells in the memory cell array 2 are of SONOS type and are virtual-ground memory cells, as described above. The memory cell array 2 is connected to the cascode amplifier 32 via DATAB. The cascode amplifier 32 is a current-voltage converting circuit that converts a cell current into a voltage, and converts the current of each memory cell for the regular data and the current of each reference cell (each cell in the reference cell array) into voltages. The differential sense amplifier 33 is a sense amplifier that compares the voltage of the memory cells for the regular data with the voltage of the reference cells, and then performs amplifying. The WR latch circuit 31 is connected to RAMDAT, and stores read data when the data is read from the memory cell array 2. When data writing is performed, the WR latch circuit 31 stores the write data.

Figure 4:
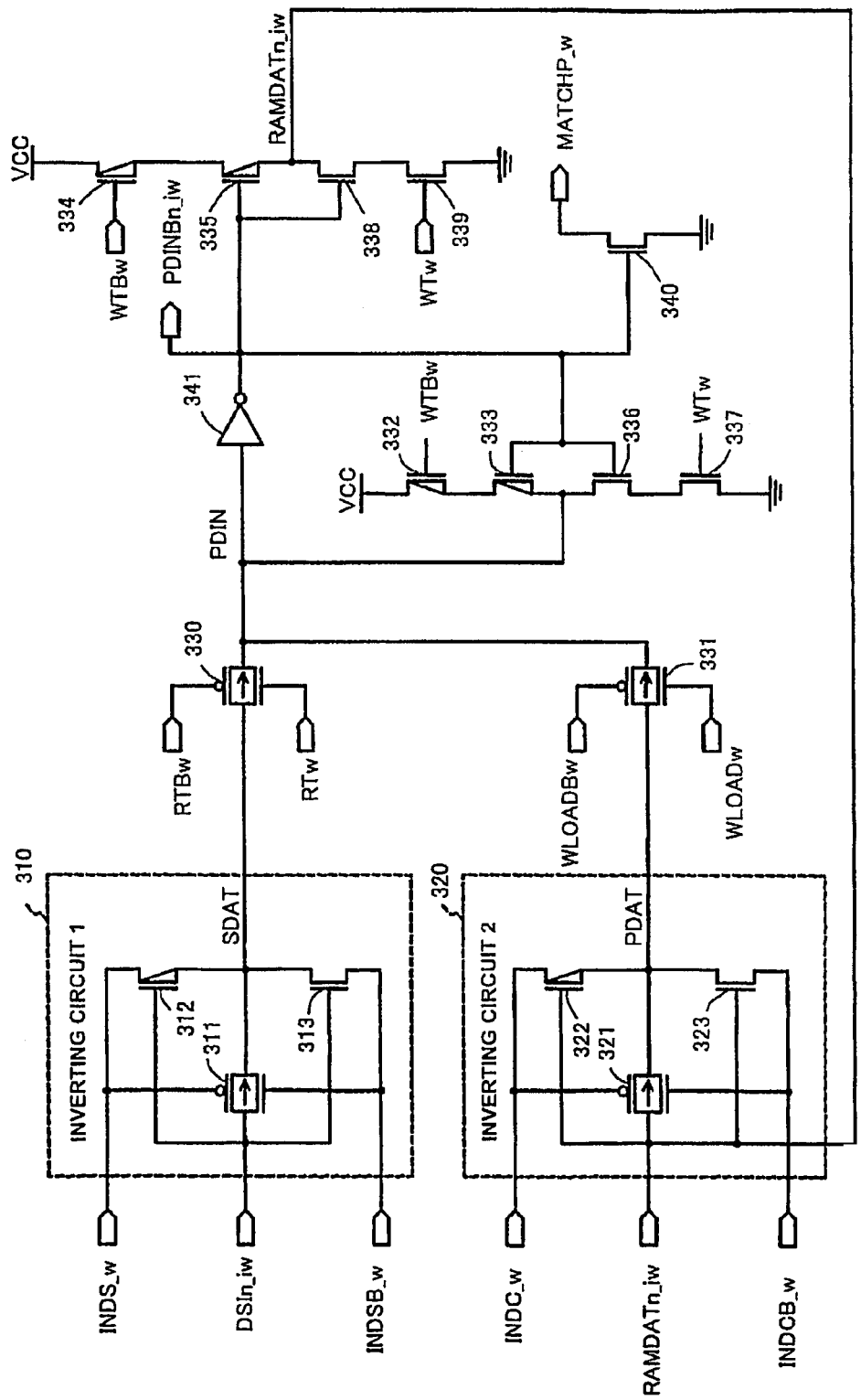
FIG. 4 is a circuit diagram of a WR latch circuit of the flash memory.

FIG. 4 is a circuit diagram of the WR latch circuit 31. The WR latch circuit 31 is formed with 536 bits, which is equivalent to the size of an internal access window. As shown in FIG. 4, the WR latch circuit 31 includes inverting circuits 310 and 320, transfer gates 330 and 331 that electrically connect to and separate from each other, n-FETs 336 through 340, p-FETs 332 through 335, and an inverter 341. The inverting circuit 310 includes a transfer gate 311, a p-FET 312, and an n-FET 313. When data is read from the memory cell array 2, the inverting circuit 310 inverts the read data in accordance with the indicator bit. At the time of data reading, the output of the differential sense amplifier 33 is input to DSIn_iw. INDS_w and INDSB_w are determined in accordance with the indicator bit. If the data in the indicator bit is "0" and the signal INDS is set at the high level, the data is inverted. The inverted or non-inverted data is stored in PDIN and PDINBn_iw. When WTw and WTBw become active, the data is output to RAMDAT through RAMDATn_iw. The N-FET 340 is connected to a pulled-up common terminal MATCH_w, thereby forming a WIRED-OR circuit.

The inverting circuit 320 includes a transfer gate 321, a p-FET 322, and an n-FET 323. When data is written into the memory cell array 2, the inverting circuit 320 inverts the data stored in the main latch circuit 42 in accordance with the indicator bit. The write data is input through a terminal RAMDATn_iw, and INDC_w and INDCB_w are determined in accordance with the indicator bit. If the data in the indicator bit is "0" and the signal INDC is set at the high level, the data is inverted. The inverted or non-inverted data is stored in PDIN and PDINBn_iw, and is output to the write amplifier circuit 34. When WTw and WTBw become active, the data is output to RAMDAT through RAMDATn_iw.

At the time of verification, the write data to be subjected to a verification process is stored from the SRAM array 40 into a node PDIN in the WR latch circuit 31. If PDIN is "0", the data is stored at the low level. If PDIN is "1", the data is stored at the high level. A sense operation is performed on the memory cells to be subjected to the verification process, and the sense data (verified data) is output from the differential sense amplifier 33 to DSIn_iw. The verified data is then stored in each PDIN. If writing is properly performed in the memory cells, the verified data is at the high level, and the data stored at the low level in the PDIN at the time of writing is inverted to the high level. Accordingly, additional writing is not necessary in the subject memory cells, and writing is not to be performed in the subject memory cells. If the data "0" is written properly in all the memory cells in which writing is performed, all the PDIN are inverted to the high level, and MATCH_w (the match signal) is set to the high level. This indicates that the verification for the subject internal access window has passed. The match signal is stored in a latch circuit (not shown) for each internal access window. The verified data stored in PDIN is restored (keeping) in the original SRAM array 40. In this manner, the verification process is repeated for each of the internal access windows of one page. If the matching signals stored in the latch circuit (not shown) indicate that the verification for each of the internal access windows has passed, the verification process ends without additional writing.

Figure 5:
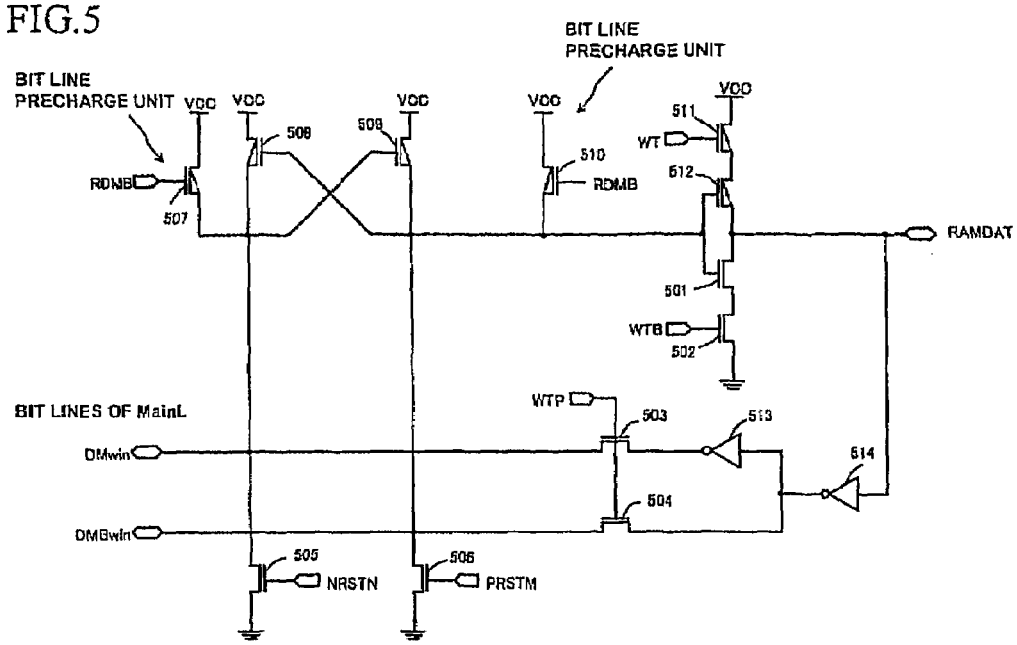
FIG. 5 is a circuit diagram of the DM bit line charge block of the SRAM array in the flash memory.

FIG. 5 is a circuit diagram of the DM bit line charge block 50. As shown in FIG. 5, the DB bit line precharge block 50 includes n-FETs 501 through 506, p-FETs 507 through 512, and inverters 513 and 514. The DM bit line charge block 50 has the function of controlling the output of the data from the differential sense amplifier 33 to the SRAM array 40 and the output of the data from the SRAM array 40 to the write amplifier circuit 34. The DM bit line charge block 50 also has the function of amplifying the data output from the differential sense amplifier 33, and the precharge and sense amplifier functions for the main latch circuit 42.

When data is read from the memory cell array 2, the DM bit line charge block 50 precharges the bit lines DM (represented by DMinw and DMBinw in the drawing) through RDMB. With WTP being set to the high level, the data output from the differential sense amplifier 33 is stored in the main latch circuit 42 through RAMDAT. When data is written in the memory cell array 2, the write data stored in the main latch circuit 42 of the SRAM array 40 is output to RAMDAT for each internal access window. Here, NRSTN and PRSTM are signals for resetting the data in the SRAM array 40.

Figure 6:
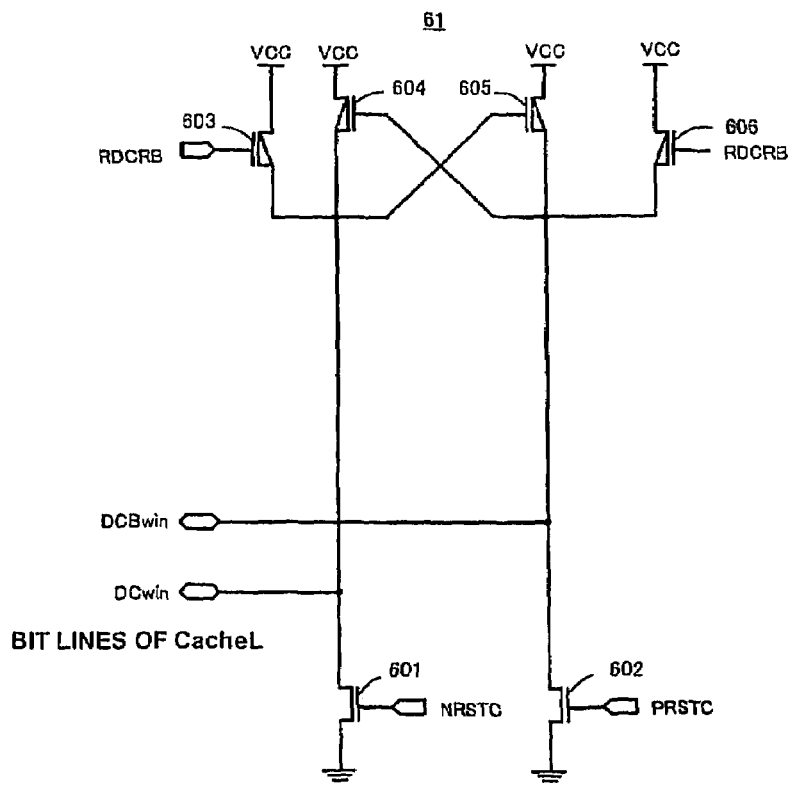
FIG. 6 is a circuit diagram showing the sense amplifier circuit of a cache latch circuit in the DC bit line charge block of the SRAM array in the flash memory.

FIG. 6 is a circuit diagram of a sense amplifier circuit 61 of the DC bit line charge block 60 for each cache latch circuit 41. As shown in FIG. 6, the sense amplifier circuit 61 of the DC bit line charge block 60 includes n-FETs 601 and 602, and p-FETs 603 through 606. The bit lines DC (represented by DCinw and DCBinw in the drawing) are precharged through RDCRB. At the time of data reading, the DC bit line charge block 60 amplifies the data in the cache latch circuit 41, and outputs the amplified data to the outside via the Y-sel 72. At the time of data writing, the DC bit line charge block 60 amplifies write data that is input from the outside via the Y-sel 72, and outputs the amplified write data to the cache latch circuit 41. Here, NRSTC and PRSTC are signals for resetting the data in the SRAM array 40.

Figure 7:
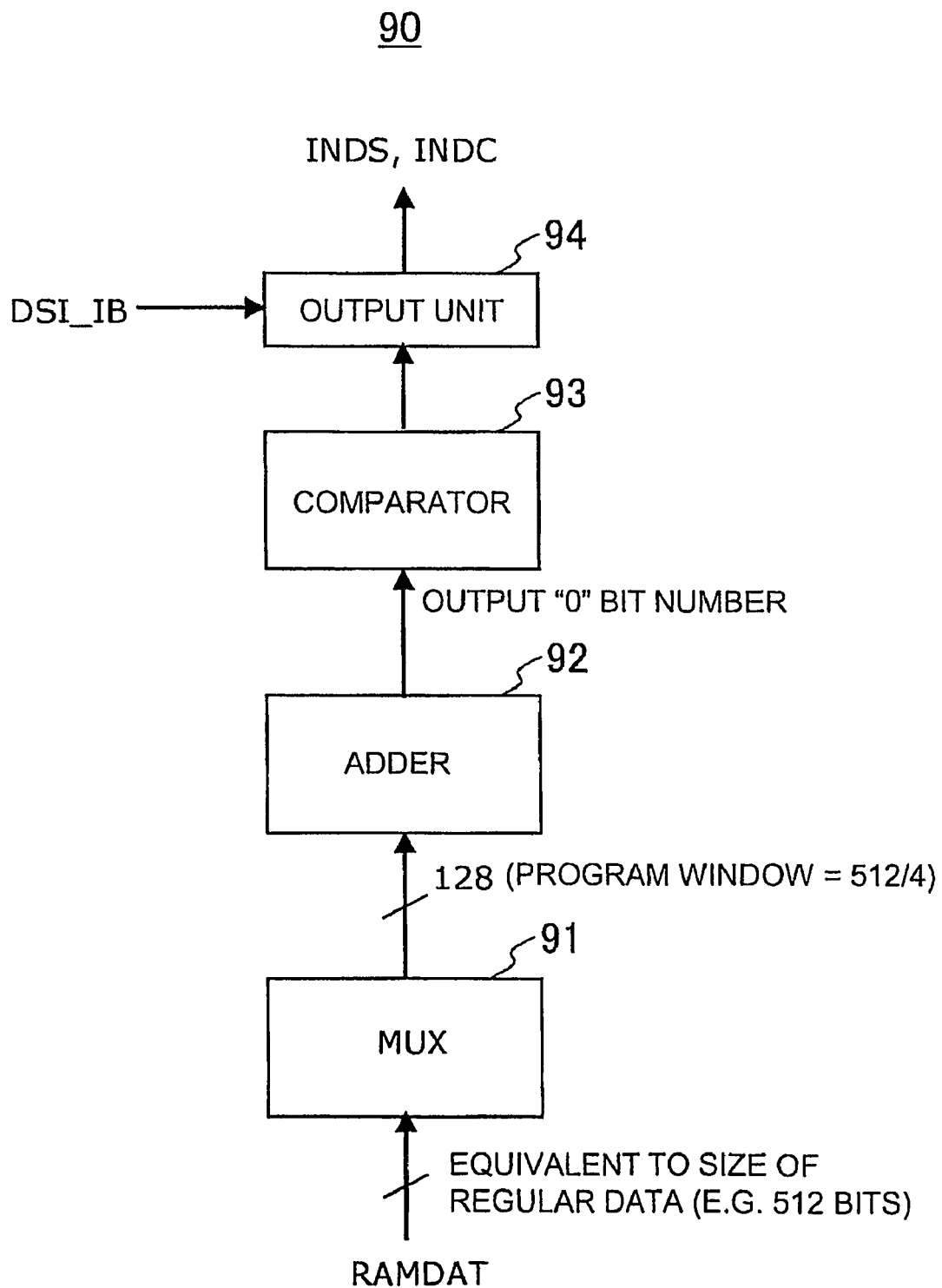
FIG. 7 illustrates a bit detector of the flash memory.

FIG. 7 illustrates the bit detector 90. As shown in FIG. 7, the bit detector 90 includes a MUX 91, an adder 92 that counts the number of bits in the "0" data for writing charges into the charge storing layer among the data in a write window, a comparator 93 that compares the number of bits detected by the adder 92 with a predetermined bit number, and an output unit 94 that outputs a flag indicating whether the data is to be inverted in accordance with the comparison result of the comparator 93. If the flag indicates that the data is to be inverted, writing is performed to set the indicator bit to "0".

Data writing into the memory cell array 2 should preferably be performed for each write window formed by dividing an internal access window, so as to reduce the current consumption at the time of writing. In the example described below, each internal access window of 536 bits is divided into four write windows. Each one write window consists of regular data of 128 bits, the indicator bit of 1 bit, spare data of 4 bits, and reference data of 1 bit, having 134 bits in total. The number of divided write windows is not limited to four, but is determined on the basis of the current consumption at the time of writing and the writing period.

If the number of "0" bits in the regular data of one write window is larger than 64 at the time of data writing into the memory cell array 2, the regular data of 128 bits are inverted. For example, in a case where there are 70 "0" bits among the regular data of 128 bits in the write window on RAMDAT, the adder 92 counts the number of "0" bits, and the comparator 93 determines whether the number of "0" bits is larger than 64. Since the number of "0" bits is larger than 64 in this example, the output INDC of the comparator 93 indicates the high level, while INDCB indicates the low level. Each of the 70 "0" bits on RAMDAT are inverted by the inverting circuit 320 in each corresponding WR latch circuit 31 shown in FIG. 4, and the node PDIN is set to the high level (PDINBn_iw being set to the low level). Thus, charges are not to be written in the charge storing layers in the memory cells.

Meanwhile, the remaining 58 "1" bits are inverted in the WR latch circuit 31, and PDIN being set to the low level (PDINBn_iw being set to the high level). As for those 58 bits, charges are to be written in the charge storing layers of the memory cells. Also, PDIN in the WR latch circuit 31 for the indicator bit is set to the low level (PDINBn_iw being set to the high level). As a result, PDIN of the WR latch circuits 31 of 64 bits (=the regular data of 58 bits+the indicator bit of 1 bit+the spare data of 4 bits+the reference data of 1 bit) are set to the low level (PDINBn_iw being set to the high level). If the above inverting operation is not performed, the number of "0" bits to be written into the charge storing layers of the memory cells should be 75 (70 bits+0 bits+4 bits+1 bit). At the time of data writing, the number of "0" bits for writing is reduced, so as to shorten the writing period and reduce the write current. In the first embodiment, the number "64", which is a half the number of the regular data cells in each write window, is used as the criterion to determine whether data should be inverted. However, the number of criteria may be decided on the basis of the writing period and the write current used at the time of data writing.

When data is read from the memory cell array 2, the data of each internal access window in one page is read and output to the WR sense amplifier block 30. At the same time, each indicator bit is read out. If the readout signal DSI_IB for an indicator bit indicates the high level or indicates that inverted data has been written, INDS_w of the WR latch circuits 31 of the corresponding regular data bits are set to the high level, while INDSB_w are set to the low level. The inverting circuit 310 of each of the WR latch circuits 31 inverts the readout data to the original data (the write data that is input from the outside), and then outputs the data to RAMDAT. Where DSI_IB is at the low level, INDS_w is at the low level. In that case, the inverting circuit 310 does not invert the readout data, and outputs the readout data to RAMDAT. These procedures are repeated sequentially for the four divided write windows, so that all the inverted or non-inverted data of one internal access window are output to RAMDAT.

Figure 8:
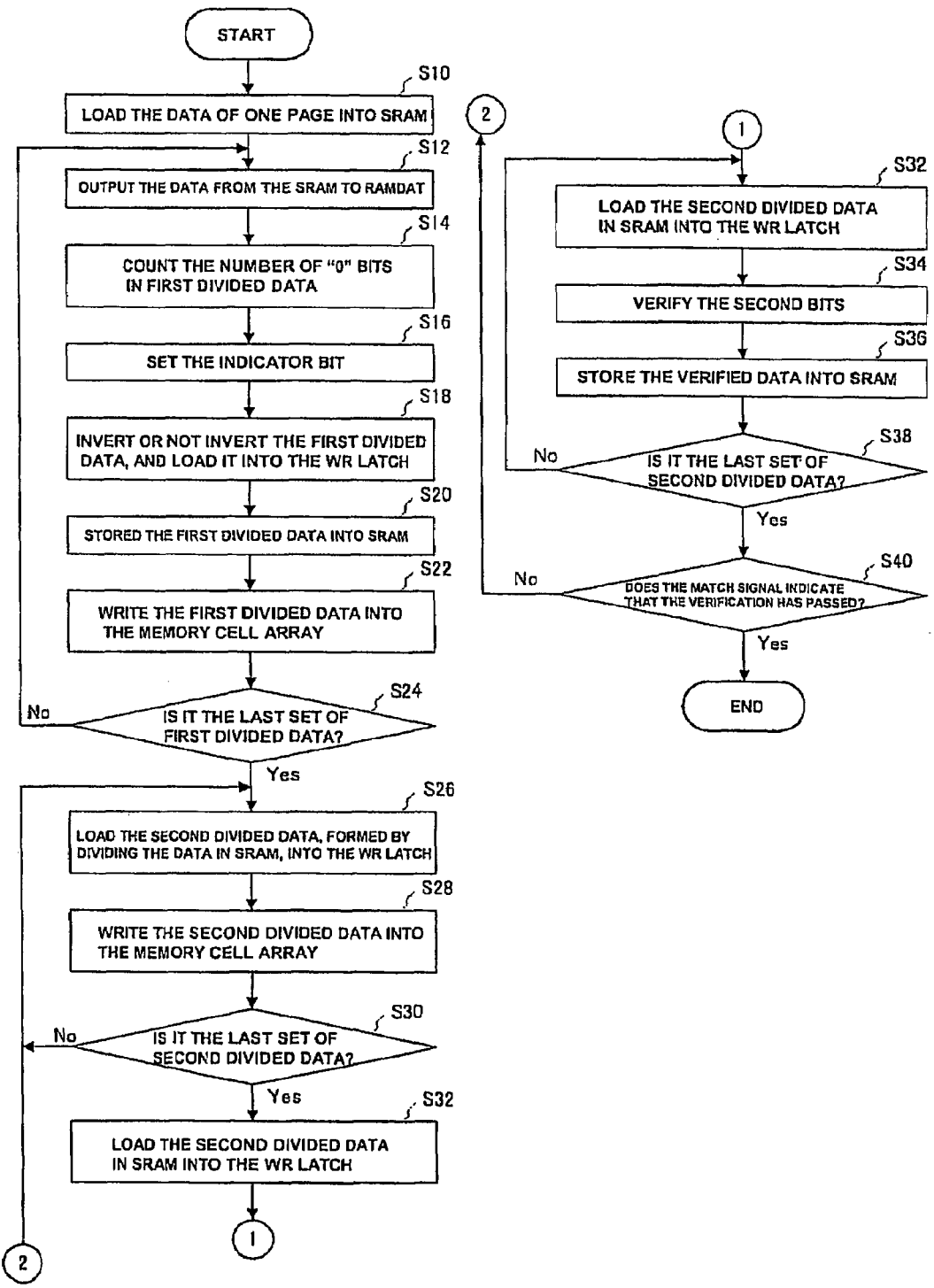
FIG. 8 is a flowchart of a control operation to be performed by the flash memory.

Referring now to FIG. 8 and FIGS. 9A through 9F, the writing mode of storing user data only in one of the two bits (the second bit) of each memory cell in the memory cell array 2 is described. FIG. 8 is a flowchart of the writing operation. FIGS. 9A through 9F schematically show the memory cells of the memory cell array 2. In each of FIGS. 9A through 9F, only eight memory cells of the memory cells 101 on the same word line 100 (of one page) are shown. The left bit in each memory cell is the first bit (the auxiliary bit not to be used in storing data that is input from users), and the right bit is the second bit (the bit to be used in storing the data that is input from the users).

Figure 9:
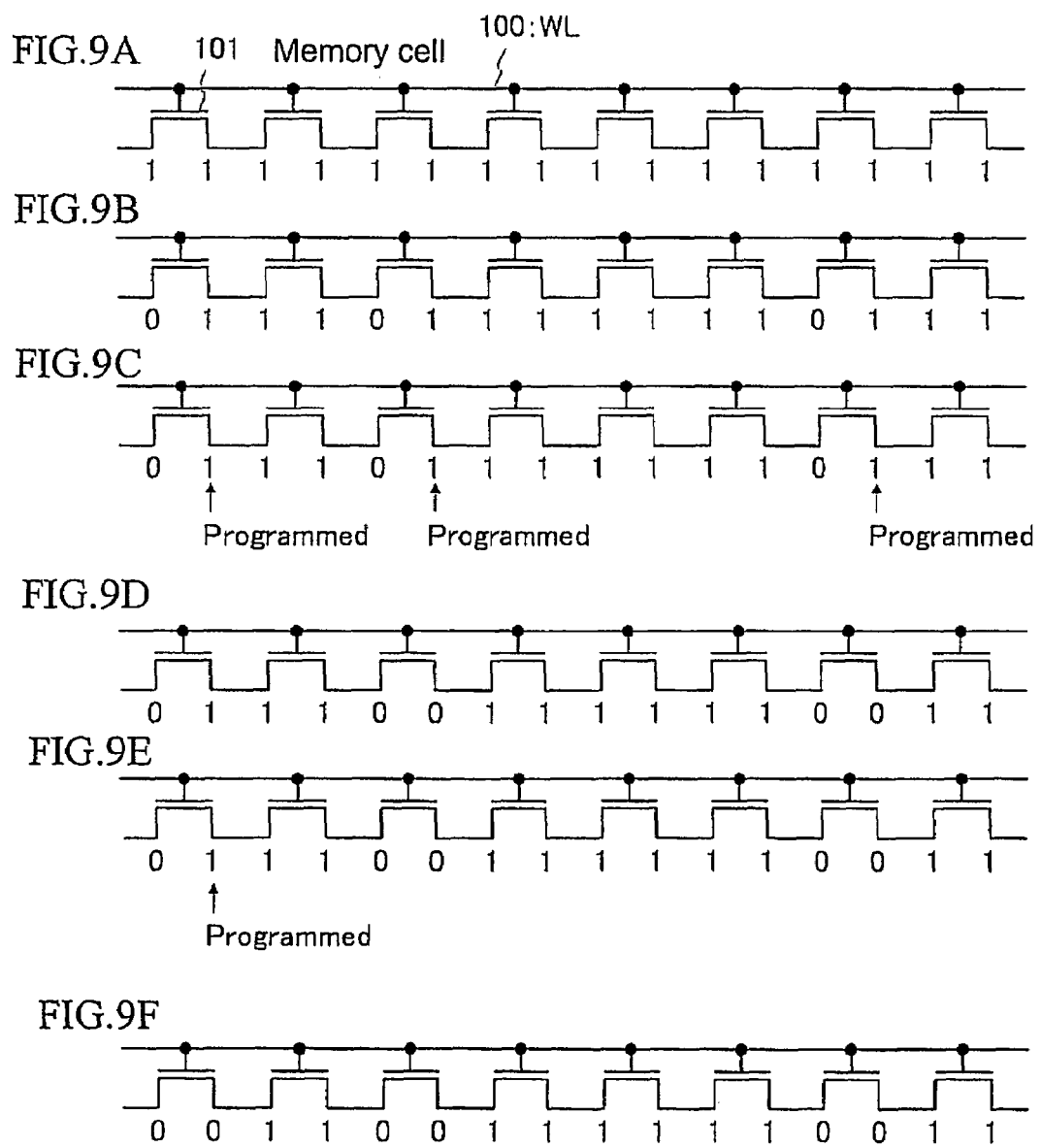
FIGS. 9A through 9F illustrate the states of the memory cells when writing is performed in the flash memory.

In FIG. 9A, all the bits in the memory cells indicate "1" after data erasing is performed in the memory cell array 2. When a write command is input from a user, the write data of one page (2 Kbytes) is loaded into the SRAM array 40 (step S10). More specifically, the write data is stored in the main latch circuits 42 of the SRAM array 40 (the first memory device).

In steps S12 through S24, writing into the first bits is performed. First, the data of the one page is divided into sets of data for the internal access window in accordance with the number of columns in the SRAM array 40. Each set of the divided data (the first divided data with 512 bits of regular data) is output to RAMDAT (step S12). The bit detector 90 then counts the number of "0" bits in the data that charges are to be written into the charge storing layers among the regular data of each one write window obtained by dividing the data of each one internal access window (the first divided data) by four (step S14). If the number of "0" bits is larger than 64, the indicator bit (the signal INDC) indicates the high level. If the number of "0" bits is not larger than 64, the indicator bit indicates the low level (step S16). If the signal INDC is at the high level, the data on RAMDAT is inverted and is then loaded into the WR latch circuits 31. If the signal INDC is at the low level, the data on RAMDAT is not inverted and is then loaded into the WR latch circuits 31 (step S18).

The inverted or non-inverted first divided data and the data of the indicator bits are stored in the SRAM array 40 via RAMDAT and the DM bit line charge block 50 (step S20). If the inverting operation is not performed, the procedure of step S20 may be unnecessary. The inverted or non-inverted divided data and the indicator bit are then written into the first bits of the memory cells in the memory cell array 2 via the write amplifier circuits 34 (step S22). As shown in FIG. 9B, writing is performed in the left bit of each memory cell. In this example, data writing is performed on the first bits of the first, third, and seventh memory cells from the left. Checking is then performed to determine whether the written first divided data is the last set of the first divided data of the page (step S24). If it is not the last set of the first divided data, the operation returns to step S12, and the above described procedures are repeated for the next divided data. If it is the last set of the first divided data, the operation moves on to step S26.

In steps S26 through S30, writing into the second bits is performed. Divided data (second divided data) from the SRAM array 40 is stored in the WR sense amplifier block 30 (step S26). Here, the bit detector 90 does not perform an operation, and the second divided data is the same as the inverted or non-inverted first divided data (inverted or non-inverted in step S20). The divided data and the data of the indicator bits are written into the second bits of the memory cells in the memory cell array 2 (step S28). As shown in FIG. 9C, writing (programming) is then performed in the right bits of the first, third, and seventh cells from the left. Checking is performed to determine whether the written data is the last divided data of the page (step S30). If it is not the last divided data, the operation returns to step S26, and the above described procedures are repeated for the next divided data. If it is the last divided data, the operation moves on to step S32.

In steps S32 through S38, second bit verification is performed. Divided data is loaded from the SRAM array 40 into the WR latch circuits 31 (step S32). Sense data is then read from the memory cell array 2 and is stored in the node PDIN of each WR latch circuit 31. As described above with reference to FIG. 4, if data is written properly in the memory cells, the data stored in PDIN is inverted. If data is not properly written, the data stored in PDIN remains unchanged (step S34). The verified data stored in PDIN is then restored to the SRAM array 40 (step S36). Checking is performed to determine whether the verified divided data is the last divided data of the page (step S38). If the verified divided data is not the last divided data, the operation returns to step S32, and the above described procedures are repeated for the next divided data. If it is the last divided data, checking is performed to determine whether all the match signals of divided data (indicating whether the verification for each set of divided data has passed) indicate that the verification has passed (step S40). If "Yes", the writing operation comes to an end. If "No", the operation returns to step S26, and an additional writing operation is performed.

In FIG. 9D, the right bit (the second bit) of the first memory cell from the left has failed and remains "1". In step S40, checking is performed to determine whether the verification has passed. If "No", writing in the failed bit is performed in steps S26 through S30. In FIG. 9E, writing (programming) is performed in the right bit of the first memory cell from the left, and verification is performed again (steps S32 through S38). If the result shows "Yes" in step S40, the writing operation comes to an end. In FIG. 9F, the first bits and the second bits of the first, third, and seventh memory cells from the left indicate "0". In this manner, when a user inputs a write command, writing is performed in the second bits only after a write pulse is applied to the first bits (auxiliary bits) of the memory cells subjected to writing in the memory cell array 2 in which the first and second bits are in an erased state. Accordingly, the data pattern in the memory cell array 2 after the writing is "1, 1" or "0, 0". When data reading is performed, only the data in the second bits are read out in the manner described with reference to FIG. 1.

In the first embodiment, the SRAM array 40 (the first memory unit) that stores data (2 Kbytes) to be written into the memory cell array 2 is provided. Also, the WR sense amplifier block 30 (the second memory unit) that holds the first divided data and the second divided data is provided. The first divided data is formed by dividing the data to be written in the memory cell array 2 into predetermined units (each having 536 bits), and is to be written into the first bits. The second divided data is to be written into the second bits. The WR sense amplifier block 30 (the control circuit) writes the second divided data into the memory cell array 2 after writing the first divided data into the memory cell array 2.

The data of one page (2 Kbytes) to be written into the memory cell array 2 is stored in the SRAM array 40 (step S10). The divided data (the first divided data), which is formed by dividing the data into the predetermined units (each including regular data of 512 bits) and is to be written into the first bits, is stored in the WR sense amplifier block 30 (step S12). The divided data is written into the memory cell array 2 (step S22). The divided data (the second divided data), which is formed by dividing the data stored in the SRAM array 40 into the predetermined units (each including regular data of 512 bits) and is to be written into the second bits, is stored in the WR sense amplifier block 30 (step S26). The divided data is then written into the memory cell array 2 (step S28).

As described above, the data to be written is stored in the SRAM array 40, the data is loaded from the SRAM array 40, writing is performed in the first bits in the memory cell array 2, and writing with the same data is then performed in the second bits in the memory cell array 2. In this manner, the writing period can be shortened. Furthermore, the writing in the second bits is performed after the writing is performed in the first bits. Accordingly, the writing in the second bits can be performed at a higher writing speed.

As in the procedures of steps S12 through S24 and steps S26 through S40, the WR sense amplifier block 30 (the control circuit) performs such a control operation that sets of first divided data or sets of second divided data are stored one by one in the WR sense amplifier block 30, and are then written into the memory cell array 2. Thus, the writing period can be shortened further.

As in the procedures of steps S12 through S24, the WR sense amplifier block 30 (the control circuit) performs such a control operation that sets of first divided data are stored one by one in the WR sense amplifier block 30 (the second memory unit), and are then written into the memory cell array 2. As in the procedures of steps S26 through S34, sets of second divided data are stored one by one in the WR sense amplifier block 30 (the second memory unit), and are then written into the memory cell array 2. Thus, the writing period can be shortened further.

Further, this embodiment includes the bit detector 90 (the counting circuit) that compares the total amount of data "0" indicating that charges are to be written into a charge storing layer among the first divided data, with a predetermined value. Based on the comparison result of the bit detector 90, the WR sense amplifier block 30 (the control circuit) inverts or does not invert the first divided data (step S18). The inverted or non-inverted first divided data is then written into the memory cell array 2 (step S22). In this manner, the number of "0" bits that consume write current is reduced. Thus, the number of bits that can be written at the same time is increased, and the total writing period can be shortened.

Furthermore, the WR sense amplifier block 30 (the control circuit) performs such a control operation that the inverted or non-inverted first divided data is restored into the SRAM array 40 (the first memory unit) (step S20). Accordingly, the SRAM array 40 holds the inverted or non-inverted first divided data. The inverted or non-inverted first divided data is then transferred as the second divided data from the SRAM array 40 to the WR sense amplifier block 30 (the second memory unit), and are then written as the second divided data into the memory cell array 2. Here, the second divided data does not need to be inverted. Thus, the period of time required for the inverting operation can be shortened.

The second bits are bits to be used, while the first bits are auxiliary bits. Therefore, the verification process and the additional writing operation are performed only for the second bits, which are the bits to be used (steps S28 and S34). Thus, the period of time required for verification can be shortened.

The sets of second divided data are stored one by one in the WR sense amplifier block (step S26), and are then written into the memory cell array 2 (step S28). The verification process is carried out for the memory cells in which the sets of second divided data are written (steps S32 through S38). Here, the verified data is stored in the SRAM array 40 (the first memory unit) (step S36). In this manner, writing is continuously performed for one page, followed by the continuous verification process for each sets of divided data. Accordingly, the voltages required for the writing operation and the verification process can be efficiently set. Thus, the period of time required for a writing operation can be shortened further.

The memory cell array 2 is a virtual-ground memory cell array, and includes SONOS memory cells. Even in a virtual-ground flash memory of the SONOS type, the writing period can be shortened.

The SRAM array 40 is a cell array having cells arranged in an array. With this structure, the number of sets of divided data can be the same as the number of columns in the SRAM array 40. Thus, data dividing can be performed with a simpler circuit structure.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array.

Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 10:
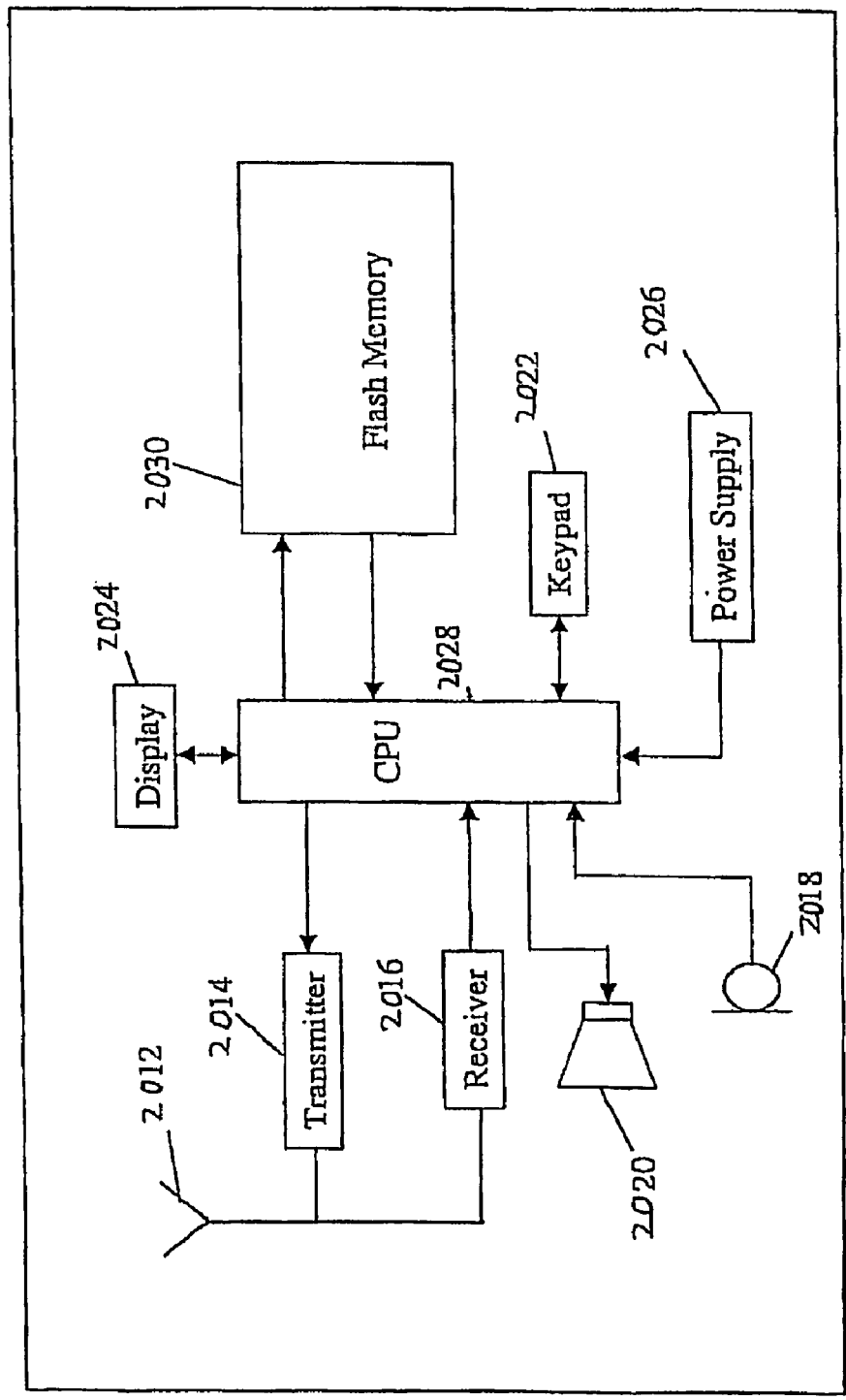
FIG. 10 illustrates a block diagram of a conventional portable phone, upon which embodiments can be implemented.

FIG. 10 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a memory cell array that has a plurality of non-volatile memory cells each having a first bit and a second bit in different regions in a charge storing layer; a first memory unit that stores data to be written into the memory cell array; a second memory unit that stores first divided data to be written into the first bit and second divided data to be written into the second bit, the first divided data being formed by dividing the data into predetermined units, the second divided data being formed by dividing the data into predetermined units; and a control circuit that writes the second divided data into the memory cell array after writing the first divided data into the memory cell array. According to the present invention, it is possible to provide a semiconductor device that can shorten the period of time required for writing data in a case where one bit is stored in each one memory cell in a flash memory that can store two bits in each one memory cell, and a method of controlling the semiconductor device. As a result, the flash memory 2030 is able to write data at a faster rate, which allows various devices, such as mobile phones, cellular phones, internet protocol phones, and/or wireless phones to function more efficiently.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 11:
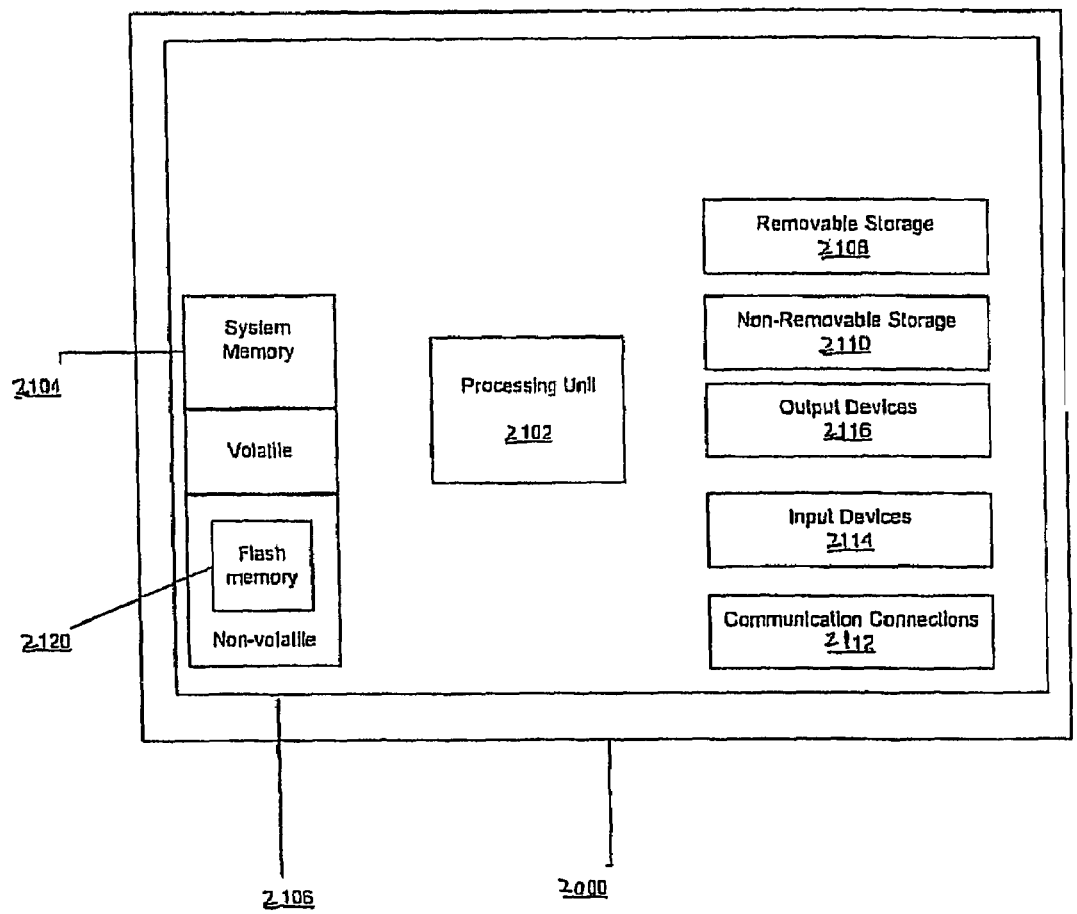
FIG. 11 illustrates a block diagram of a computing device, upon which embodiments of the present claimed subject matter can be implemented.

FIG. 11 illustrates a block diagram of a computing device 2100, upon which embodiments of the present claimed subject matter can be implemented. Although computing device 2100 is shown and described in FIG. 11 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 11.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 11 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a memory cell array that has a plurality of non-volatile memory cells each having a first bit and a second bit in different regions in a charge storing layer; a first memory unit that stores data to be written into the memory cell array; a second memory unit that stores first divided data to be written into the first bit and second divided data to be written into the second bit, the first divided data being formed by dividing the data into predetermined units, the second divided data being formed by dividing the data into predetermined units; and a control circuit that writes the second divided data into the memory cell array after writing the first divided data into the memory cell array. According to the present invention, it is possible to provide a semiconductor device that can shorten the period of time required for writing data in a case where one bit is stored in each one memory cell in a flash memory that can store two bits in each one memory cell, and a method of controlling the semiconductor device. As a result, the flash memory 2030 is able to write data at a faster rate, which allows various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones to function more efficiently. Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 12:
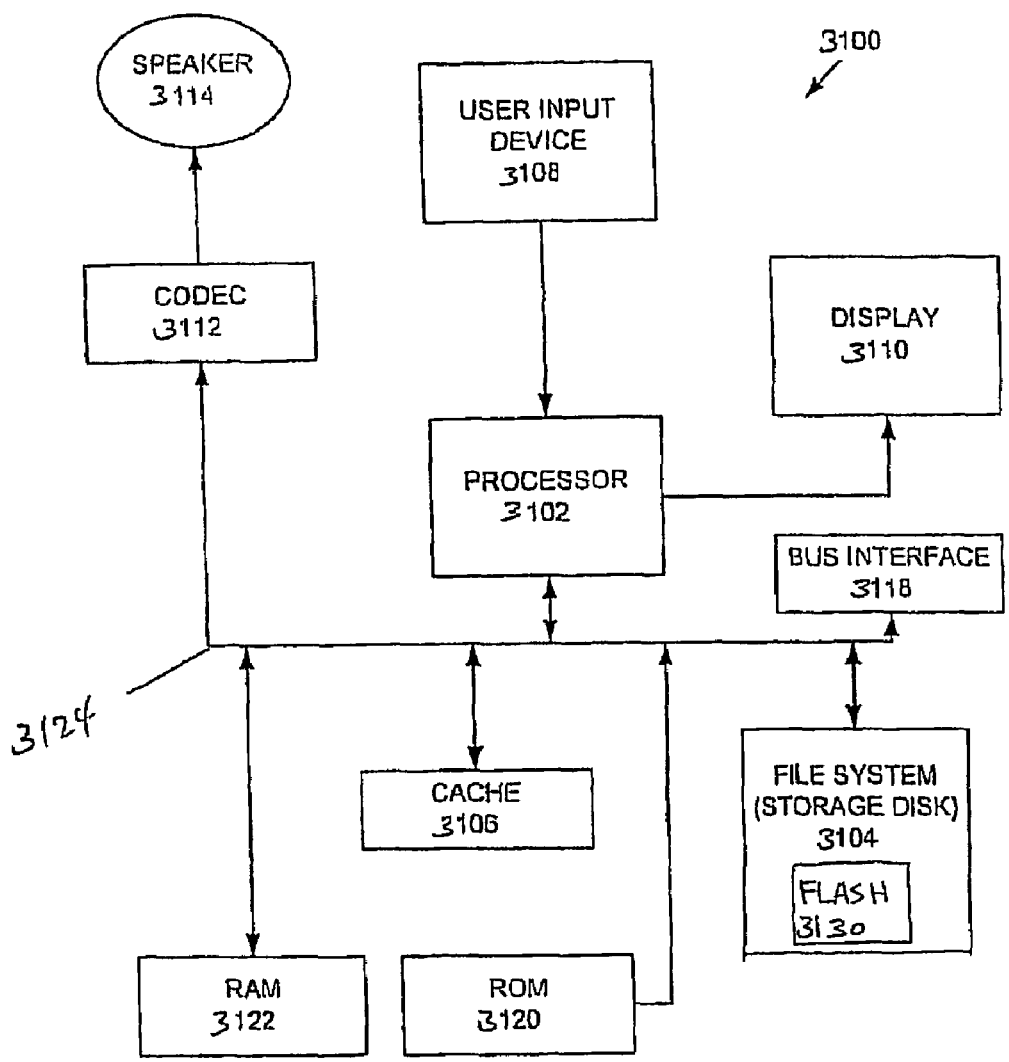
FIG. 12 illustrates an exemplary portable multimedia device, or media player, in accordance with an embodiment of the invention.

FIG. 12 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a memory cell array that has a plurality of non-volatile memory cells each having a first bit and a second bit in different regions in a charge storing layer; a first memory unit that stores data to be written into the memory cell array; a second memory unit that stores first divided data to be written into the first bit and second divided data to be written into the second bit, the first divided data being formed by dividing the data into predetermined units, the second divided data being formed by dividing the data into predetermined units; and a control circuit that writes the second divided data into the memory cell array after writing the first divided data into the memory cell array. According to the present invention, it is possible to provide a semiconductor device that can shorten the period of time required for writing data in a case where one bit is stored in each one memory cell in a flash memory that can store two bits in each one memory cell, and a method of controlling the semiconductor device. As a result, the flash memory 2030 is able to write data at a faster rate, which allows various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones to function more efficiently. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CO-DEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various aspects of the present invention are summarized below. According to a first aspect of the present invention, there is provided a semiconductor device including: a memory cell array that has a plurality of non-volatile memory cells each having a first bit and a second bit in different regions in a charge storing layer; a first memory unit that stores data to be written into the memory cell array; a second memory unit that stores first divided data to be written into the first bit and second divided data to be written into the second bit, the first divided data being formed by dividing the data into predetermined units, the second divided data being formed by dividing the data into predetermined units; and a control circuit that writes the second divided data into the memory cell array after writing the first divided data into the memory cell array. The data to be written is stored in the first memory unit, and the data is loaded from the first memory unit and is written into the first bits in the memory cell array. Writing of the same data is then performed in the second bits in the memory cell array. Thus, the period of time required for a writing operation can be shortened.

In the above-described semiconductor device, the control circuit may store a plurality of sets of the first divided data one by one in the second memory unit and performs the writing into the memory cell array, and then stores a plurality of sets of the second divided data one by one in the second memory unit and performs the writing into the memory cell array. In accordance with the present invention, the period of time required for a writing operation can be shortened.

The above-described semiconductor device may further include: a counting circuit that compares the total amount of written data among the first divided data with a predetermined value, the control circuit inverts the first divided data, based on the comparison result of the counting circuit. In the above-described semiconductor device, the control circuit may write the inverted first divided data into the memory cell array. In accordance with the present invention, the number of memory cells in which "0" is to be written is reduced, so as to reduce the consumption of write current. Accordingly, the number of bits that can be written at the same time can be increased, and the total period of time required for data writing can be shortened.

In the above-described semiconductor device, the control circuit may restore the inverted first divided data to the first memory unit, then stores the inverted first divided data in the second memory unit, and writes the inverted first divided data into the memory cell array. In accordance with the present invention, an inverting operation does not need to be performed for the second divided data. Thus, the period of time required for an inverting operation can be shortened.

In the above-described semiconductor device, the second bit may be a bit to be used, while the first bit is an auxiliary bit. The control circuit may carry out a verification process only for the second bit. In accordance with the present invention, the verification process is performed only for the bits to be used. Thus, the period of time required for verification can be shortened.

In the above-described semiconductor device, the memory cell array may be of a virtual ground type. The memory cell array may have SONOS memory cells. In accordance with the present invention, the writing period can be shortened even in a virtual-ground flash memory of the SONOS type.

In the above-described semiconductor device, the first memory unit may be a cell array having cells arranged in an array structure. For example, the number of sets of divided data is made equal to the number of columns in the array. Thus, data dividing can be performed with a simpler circuit structure.

According to a second aspect of the present invention, there is provided a method of controlling a semiconductor device that has a memory cell array having non-volatile memory cells each having a first bit and a second bit in different regions in a charge storing layer, the method comprising the steps of: storing, in a first memory unit, data to be written into the memory cell array; storing, in a second memory unit, first divided data to be written into the first bit, the first divided data being formed by dividing the data into predetermined units, writing the first divided data into the memory cell array; storing, in the second memory unit, second divided data to be written into the second bit, the second divided data being formed by dividing the data into predetermined units; and writing the second divided data into the memory cell array after writing the first divided data into the memory cell array. The data to be written is stored in the first memory unit, and the data is loaded from the first memory unit and is written into the first bits in the memory cell array. Writing of the same data is then performed in the second bits in the memory cell array. Thus, the period of time required for a writing operation can be shortened.

In the above-described method, a plurality of sets of the first divided data may be stored one by one in the second memory unit and are written into the memory cell array; and a plurality of sets of the second divided data are stored one by one in the second memory unit and are written into the memory cell array. In accordance with the present invention, the period of time required for a writing operation can be shortened.

The above-described method may further including the steps of: comparing the total amount of written data among the first divided data with a predetermined value; and inverting the first divided data, based on a result of the comparison with the predetermined value.

In the above-described method, the step of writing the first divided data may be carried out by writing the inverted first divided data into the memory cell array. In accordance with the present invention, the number of memory cells in which "0" is to be written is reduced, so as to reduce the consumption of write current. Accordingly, the number of bits that can be written at the same time can be increased, and the total period of time required for data writing can be shortened.

The above-described method may further include the step of restoring the inverted first divided data to the first memory unit, wherein the step of storing the second divided data is carried out by storing the inverted first divided data as the second divided data in the second memory unit. In accordance with the present invention, an inverting operation does not need to be performed for the second divided data. Thus, the period of time required for an inverting operation can be shortened.

The above-described method may further include the step of performing a verification process only for the second bit. In accordance with the present invention, the verification process is performed only for the bits to be used. Thus, the period of time required for verification can be shortened.

In the above-described method, the step of storing the second divide data and the step of writing the second divided data may be carried out for a plurality of sets of second divided data one by one; and the step of performing the verification process may be then carried out, the step of performing the verification process may include the step of storing verified data in the first memory unit. Thus, the period of time required for a writing operation can be shortened further.

As described above, the present invention can provide a semiconductor device that can shorten the period of time required for writing data in a case where one bit is stored in each one memory cell in a flash memory that can store two bits in each one memory cell, and a method of controlling such a semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising:
a memory cell array that has a plurality of non-volatile memory cells each having a first bit and a second bit in different regions in a charge storing layer;
a first memory unit that stores data to be written into the memory cell array;
a second memory unit that stores first divided data to be written into the first bit and second divided data to be written into the second bit, the first divided data being formed by dividing the data into predetermined units, the second divided data being formed by dividing the data into predetermined units; and
a control circuit that writes the second divided data into the memory cell array after writing the first divided data into the memory cell array.

2. The semiconductor device as claimed in claim 1, wherein the control circuit stores a plurality of sets of the first divided data one by one in the second memory unit and performs the writing into the memory cell array, and then stores a plurality of sets of the second divided data one by one in the second memory unit and performs the writing into the memory cell array.

3. The semiconductor device as claimed in claim 1, further comprising:
a counting circuit that compares the total amount of written data among the first divided data with a predetermined value,
the control circuit inverts the first divided data, based on the comparison result of the counting circuit.

4. The semiconductor device as claimed in claim 3, wherein the control circuit writes the inverted first divided data into the memory cell array.

5. The semiconductor device as claimed in claim 4, wherein
the control circuit restores the inverted first divided data to the first memory unit,
then stores the inverted first divided data as the second divided data in the second memory unit, and writes the inverted first divided data into the memory cell array.

6. The semiconductor device as claimed in claim 1, wherein the second bit is a bit to be used, while the first bit is an auxiliary bit.

7. The semiconductor device as claimed in claim 1, wherein the control circuit carries out a verification process only for the second bit.

8. The semiconductor device as claimed in claim 1, wherein the memory cell array is of a virtual ground array type.

9. The semiconductor device as claimed in claim 1, wherein the memory cell array has SONOS memory cells.

10. The semiconductor device as claimed in claim 1, wherein the first memory unit is a cell array having cells arranged in an array.

11. A method of controlling a semiconductor device that has a memory cell array having non-volatile memory cells each having a first bit and a second bit in different regions in a charge storing layer,
the method comprising the steps of:
storing, in a first memory unit, data to be written into the memory cell array;
storing, in a second memory unit, first divided data to be written into the first bit, the first divided data being formed by dividing the data into predetermined units,
writing the first divided data into the memory cell array;
storing, in the second memory unit, second divided data to be written into the second bit, the second divided data being formed by dividing the data into predetermined units; and
writing the second divided data into the memory cell array after writing the first divided data into the memory cell array.

12. The method as claimed in claim 11, wherein:
a plurality of sets of the first divided data are stored one by one in the second memory unit and are written into the memory cell array; and
a plurality of sets of the second divided data are stored one by one in the second memory unit and are written into the memory cell array.

13. The method as claimed in claim 11, further comprising the steps of:
comparing the total amount of written data among the first divided data with a predetermined value; and
inverting the first divided data, based on a result of the comparison with the predetermined value.

14. The method as claimed in claim 13, wherein the step of writing the first divided data is carried out by writing the inverted first divided data into the memory cell array.

15. The method as claimed in claim 14, further comprising the step of
storing the inverted first divided data to the first memory unit, wherein the step of storing the second divided data is carried out by storing the inverted first divided data as the second divided data in the second memory unit.

16. The method as claimed in claim 11, further comprising the step of performing a verification process only for the second bit.

17. The method as claimed in claim 16, wherein:
the step of storing the second divide data and the step of writing the second divided data are carried out for a plurality of sets of second divided data one by one; and
the step of performing the verification process is then carried out,
the step of performing the verification process includes the step of storing verified data in the first memory unit.

18. A wireless communications device, said wireless communications device comprising:
a flash memory comprising:
a memory cell array that has a plurality of non-volatile memory cells each having a first bit and a second bit in different regions in a charge storing layer;
a first memory unit that stores data to be written into the memory cell array;
a second memory unit that stores first divided data to be written into the first bit and second divided data to be written into the second bit, the first divided data being formed by dividing the data into predetermined units, the second divided data being formed by dividing the data into predetermined units; and
a control circuit that writes the second divided data into the memory cell array after writing the first divided data into the memory cell array;
a processor;
a communications component;
a transmitter;
a receiver; and
an antenna connected to the transmitter circuit and the receiver circuit.

19. The wireless communications device of claim 18, wherein said flash memory is NAND flash memory.

20. The wireless communications device of claim 18, wherein said flash memory is NOR flash memory.

21. The wireless communications device of claim 18, wherein said flash memory utilizes mirrorbits technology.

22. A computing device comprising:
a processor;
an input component;
an output component;
a memory comprising:
a volatile memory; and
a flash memory comprising:
a memory cell array that has a plurality of non-volatile memory cells each having a first bit and a second bit in different regions in a charge storing layer;
a first memory unit that stores data to be written into the memory cell array;
a second memory unit that stores first divided data to be written into the first bit and second divided data to be written into the second bit, the first divided data being formed by dividing the data into predetermined units, the second divided data being formed by dividing the data into predetermined units; and
a control circuit that writes the second divided data into the memory cell array after writing the first divided data into the memory cell array.

23. The computing device of claim 22, wherein said computing device is a personal computer (PC).

24. The computing device of claim 22, wherein said computing device is a personal digital assistant (PDA).

25. The computing device of claim 22, wherein said computing device is a gaming system.

26. A portable media player comprising:
a processor;
a cache;
a user input component;
a coder-decoder component; and
a memory comprising:
a flash memory comprising:
a memory cell array that has a plurality of non-volatile memory cells each having a first bit and a second bit in different regions in a charge storing layer;
a first memory unit that stores data to be written into the memory cell array;
a second memory unit that stores first divided data to be written into the first bit and second divided data to be written into the second bit, the first divided data being formed by dividing the data into predetermined units, the second divided data being formed by dividing the data into predetermined units; and
a control circuit that writes the second divided data into the memory cell array after writing the first divided data into the memory cell array.

27. The portable media player of claim 26, wherein said portable media player is a portable music player.

28. The portable media player of claim 26, wherein said portable media player is a portable video player.

* * * * *